(12) United States Patent
Otremba et al.

(10) Patent No.: US 11,676,881 B2
(45) Date of Patent: Jun. 13, 2023

(54) SEMICONDUCTOR PACKAGE, SEMICONDUCTOR ASSEMBLY AND METHOD FOR FABRICATING A SEMICONDUCTOR PACKAGE

(71) Applicant: Infineon Technologies AG, Neubiberg (DE)

(72) Inventors: Ralf Otremba, Kaufbeuren (DE); Teck Sim Lee, Melaka (MY); Klaus Schiess, Allensbach (DE); Xaver Schloegel, Sachsenkam (DE); Lee Shuang Wang, Melaka (MY); Mohd Hasrul Zulkifli, Selangor (MY)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 16/929,223

(22) Filed: Jul. 15, 2020

(65) Prior Publication Data
US 2021/0020539 A1 Jan. 21, 2021

(30) Foreign Application Priority Data
Jul. 15, 2019 (DE) .................. 10 2019 119 118.1

(51) Int. Cl.
*H01L 23/367* (2006.01)
*H01L 23/12* (2006.01)
*H01L 23/31* (2006.01)
*H01L 21/48* (2006.01)

(52) U.S. Cl.
CPC ...... *H01L 23/3677* (2013.01); *H01L 21/4871* (2013.01); *H01L 23/12* (2013.01); *H01L 23/3107* (2013.01)

(58) Field of Classification Search
CPC ....... H01L 23/36–3738; H01L 23/4006–4093; H01L 23/3121–3128
See application file for complete search history.

(56) References Cited

U.S. PATENT DOCUMENTS

| | | | |
|---|---|---|---|
| 4,626,805 A | 12/1986 | Jones | |
| 6,154,372 A | 11/2000 | Kalivas et al. | |
| 6,603,665 B1 | 8/2003 | Truong et al. | |
| 8,023,268 B2 * | 9/2011 | Fukuzono | H01L 23/433 174/16.3 |
| 9,157,610 B2 | 10/2015 | Yu et al. | |
| 9,161,473 B2 | 10/2015 | Hayashi et al. | |
| 10,020,407 B2 | 7/2018 | Usui | |

(Continued)

FOREIGN PATENT DOCUMENTS

| | | |
|---|---|---|
| EP | 0200291 | 11/1986 |
| EP | 0642166 | 3/1995 |

(Continued)

*Primary Examiner* — Amar Movva
(74) *Attorney, Agent, or Firm* — Dicke, Billig & Czaja, PLLC

(57) ABSTRACT

A semiconductor package is disclosed. In one example, the semiconductor package includes a chip carrier, a semiconductor chip attached to the chip carrier, an encapsulation body encapsulating the semiconductor chip, and a mounting hole configured to receive a screw for screw mounting a heatsink onto a first side of the semiconductor package. A second side of the semiconductor package opposite the first side is configured to be surface mounted to an application board.

20 Claims, 5 Drawing Sheets

(56) References Cited

U.S. PATENT DOCUMENTS

| | | |
|---|---|---|
| 2006/0027921 A1 | 2/2006 | Chiu et al. |
| 2008/0296753 A1 | 12/2008 | Carter |
| 2009/0091021 A1 | 4/2009 | Nakamura |
| 2011/0094096 A1 | 4/2011 | Chainer |
| 2016/0079155 A1* | 3/2016 | Kawase ................ H01L 23/053 257/712 |

FOREIGN PATENT DOCUMENTS

| | | |
|---|---|---|
| EP | 2515352 | 10/2012 |
| EP | 3118899 | 1/2017 |

* cited by examiner

SEMICONDUCTOR PACKAGE, SEMICONDUCTOR ASSEMBLY AND METHOD FOR FABRICATING A SEMICONDUCTOR PACKAGE

CROSS-REFERENCE TO RELATED APPLICATION

This Utility Patent Application claims priority to German Patent Application No. 10 2019 119 118.1, filed Jul. 15, 2019, which is incorporated herein by reference.

TECHNICAL FIELD

This disclosure relates in general to a semiconductor package, a semiconductor assembly and a method for fabricating a semiconductor package.

BACKGROUND

A semiconductor package, in particular a power semiconductor package may generate a considerable amount of heat during operation. In order to prevent such a semiconductor package from overheating, it may be necessary to provide dedicated heat dissipation means. Semiconductor packages of the SMD type (SMD—surface mounted device) can be mounted onto an application board and heat dissipation is carried out via the application board. However, application boards may have a considerable thermal resistance, which may negatively affect heat dissipation efficiency. Improved semiconductor packages, improved semiconductor assemblies and improved methods for fabricating semiconductor packages may help to solve these and other problems.

The problem on which the invention is based is solved by the features of the independent claims. Further advantageous examples are described in the dependent claims.

SUMMARY

Various aspects pertain to a semiconductor package comprising a chip carrier, a semiconductor chip attached to the chip carrier, an encapsulation body encapsulating the semiconductor chip, and a mounting hole configured to receive a screw for screw mounting a heatsink onto a first side of the semiconductor package, wherein a second side of the semiconductor package opposite the first side is configured to be surface mounted to an application board.

Various aspects pertain to a semiconductor assembly comprising a semiconductor package, comprising a chip carrier, a semiconductor chip attached to the chip carrier, an encapsulation body encapsulating the semiconductor chip, and a mounting hole, wherein the semiconductor assembly further comprises a heatsink arranged on a first side of the semiconductor package, a screw arranged in the mounting hole and mounting the heatsink to the first side of the semiconductor package, and an application board, wherein a second side of the semiconductor package opposite the first side is surface mounted to the application board.

Various aspects pertain to a method for fabricating a semiconductor package, the method comprising: providing a chip carrier, attaching a semiconductor chip to the chip carrier, encapsulating the semiconductor chip with an encapsulation body, and fabricating a mounting hole in the semiconductor package, the mounting hole being configured to receive a screw for screw mounting a heatsink onto a first side of the semiconductor package, wherein a second side of the semiconductor package opposite the first side is configured to be surface mounted to an application board.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following, the terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor package may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, chips with integrated passives, etc. The examples may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor packages described below may include one or more semiconductor chips. By way of example, one or more semiconductor power chips may be included. Further, one or more logic integrated circuits may be included in the semiconductor packages. The logic integrated circuits may be configured to control the integrated circuits of other semiconductor chips, for example the integrated circuits of power semiconductor chips. The logic integrated circuits may be implemented in logic chips.

Figure 1A:
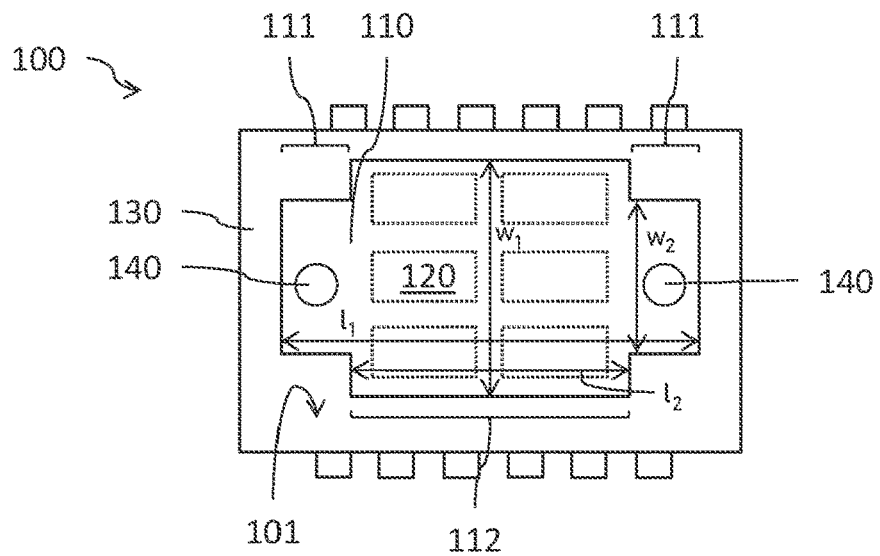
FIGS. 1A and 1B show a top down view (FIG. 1A) and a side view (FIG. 1B) of an SMD-type semiconductor package comprising a mounting hole configured to receive a mounting screw.

FIG. 1A shows a top-down view of a semiconductor package 100 that comprises a chip carrier (or die carrier) 110, a semiconductor chip (or semiconductor die) 120 attached to the chip carrier 110, an encapsulation body 130 encapsulating the semiconductor chip 120 and a mounting hole 140 configured to receive a screw for screw mounting a heatsink onto a first side 101 of the semiconductor package 100. A second side 102 (compare FIG. 1B) of the semiconductor package 100, opposite the first side 101 is configured to be surface mounted to an application board.

The semiconductor package 100 may be a surface mounted device (SMD). The semiconductor package 100 may for example be a power semiconductor device that is configured to handle high electrical currents and/or high voltages. The semiconductor package 100 may comprise a power circuit, for example it may comprise an AC/DC-converter circuit, a DC/DC-converter circuit, a half-bridge circuit, etc. The semiconductor package 100 may comprise a logic circuit that is configured to control the power circuit.

The semiconductor package 100, in particular the (power) semiconductor chip 120 may produce heat during operation and dedicated heat dissipation means may be necessary to keep the temperature in the semiconductor package 100 at an acceptable or an optimum level. Dissipating heat towards the first side 101 of the semiconductor package 100 (e.g. by attaching a heatsink onto the first side 101) may be more efficient than dissipating heat towards the second side 102 in the case that the semiconductor package 100 is arranged on e.g. an application board with the second side 102 facing the application board. This may be due to the fact that an application board like a printed circuit board (PCB) is a comparatively poor thermal conductor and therefore may put tight constraints on the amount of heat that can be dissipated from the semiconductor package 100 via the application board. At least for these reasons, it may be more efficient to dissipate heat via the first side 101.

The chip carrier 110 may be any suitable sort of chip carrier, e.g. a leadframe, a DCB, a DAB, an AMB, etc. and it may comprise or consist of any suitable material, e.g. a metal like Al, Cu or Fe or a metal alloy. The chip carrier 110 may be at least partially exposed at the first side 101 of the semiconductor package 100. The chip carrier 110 may be configured to carry the semiconductor chip 120 and it may be further configured to carry additional electronic or electric components like diodes or capacitors.

The chip carrier 110 may have any suitable dimensions. For example, the chip carrier 110 may have a length $l_1$ of about 3 cm, 5 cm, 7 cm or 10 cm. A width $w_1$ of the chip carrier 110 may be about 3 cm, 4 cm, 5 cm or 7 cm.

According to an example, the chip carrier 110 may comprise one or more fixture portions 111 and one or more die mounting portions 112, wherein each fixture portions 111 comprises a mounting hole 140 but no semiconductor chip is attached to a fixture portion 111 and wherein each die mounting portion 112 is configured to have a semiconductor chip 120 attached to it (but no mounting hole 140 may be arranged in the die mounting portion 112). The chip carrier 110 may for example comprise a central die mounting portion 112 and two lateral fixture portions 111 as shown in FIG. 1A. A length $l_2$ of the die mounting portion 112 may be about 2 cm, 3 cm, 4 cm or 5 cm. A width w2 of the fixture portion 111 may be about 1cm, 2 cm or 3 cm. The die mounting portion 112 may account for the bulk of the chip carrier 110.

The chip carrier 110 may have any suitable thickness (measured perpendicular to length and width). For example, the thickness may be in the range of several hundred micrometers to several millimeters. The thickness may be uniform across the whole chip carrier 110, in particular the fixture portion 111 and the die mounting portion 112 may have the same thickness. However, it is also possible that the fixture portion 111 and the die mounting portion 112 have different thicknesses.

The semiconductor chip 120 may e.g. be a power semiconductor die, wherein a first power electrode (e.g. a source electrode, drain electrode, emitter electrode or collector electrode) is arranged on a first side of the semiconductor chip 120 facing the chip carrier 110 and is electrically coupled to the chip carrier 110. A second power electrode may be arranged on an opposite second side of the semiconductor chip 120.

The encapsulation body 130 may e.g. be a molded body. The encapsulation body 130 may comprise a polymer, a plastic or an epoxy. The encapsulation body 130 may completely encapsulate the semiconductor chip 120. An outer surface of the chip carrier 110 may be coplanar or essentially coplanar with an outer surface of the encapsulation body 130 on the first side 101 of the semiconductor package 100. A length and a width of the encapsulation body 130 may essentially correspond to the length and width of the chip carrier 110. The length and width of the encapsulation body 130 may e.g. each be no more than several millimeters or no more than a few centimeters larger than the length and width of the chip carrier 110.

The mounting hole 140 may be configured to accept any suitable screw, for example an M3 screw, or a suitable rivet. In the context of this application, "screw" and "rivet" may be used interchangeably. The mounting hole 140 may completely extend through the semiconductor package 100 from the first side 101 to the second side 102 (compare FIG. 1B). Alternatively, the mounting hole 140 may only partially extend through the semiconductor package 140, e.g. about halfway through. The mounting hole 140 may have any suitable diameter, for example a diameter of about 1 mm, 2 mm, 3 mm, 3.2 mm, 4 mm, 5 mm, 5.2 mm or more.

The semiconductor package 100 may comprise any suitable number of mounting holes 140, e.g. a single mounting hole 140, two mounting holes 140 or more.

The one or more mounting holes 140 may be arranged in the semiconductor package 100 in any suitable manner. However, in the layout of the mounting hole(s) 140 on the chip carrier 110, the layout of the semiconductor chip(s) 120 on the chip carrier 110 has to be taken into account. For example, it may be necessary to arrange electrical connections to and from the semiconductor chip(s) 120 (e.g. conductive traces) around the mounting hole(s) 140.

According to an example, the semiconductor package 100 comprises two mounting holes 140 that are arranged at opposing edges of the chip carrier 110 as shown in FIG. 1A.

According to another example, the semiconductor package 100 comprises a single mounting hole 140 which may e.g. be arranged in the center of the chip carrier 110. It is also possible, that two mounting holes 140 are arranged in the center of the chip carrier 110 or that the single mounting hole 140 is arranged at an edge of the chip carrier 110.

The mounting hole 140 may be arranged in the chip carrier 110 (that is, the mounting hole 140 may extend through the chip carrier 110). However, it is also possible that the mounting hole 140 does not extend through the chip carrier 110 but instead extends only through the encapsulation body 130, laterally besides the chip carrier 110. According to yet another example, the semiconductor package 100 may comprise a dedicated leadframe part that comprises the mounting hole 140, wherein the dedicated leadframe part is different from the chip carrier 110 and may e.g. be arranged laterally besides the chip carrier 110. The dedicated leadframe part may be electrically insulated from the chip carrier 110.

In the case that the mounting hole(s) 140 extend through the chip carrier 110, it is possible that the mounting hole 140 is configured to electrically insulate a screw in the mounting hole 140 from the chip carrier 110. This may e.g. be achieved by arranging an insulating material on the inner surface of the mounting hole 140. According to an example, this insulating material may correspond to the material (e.g. polymer) of the encapsulation body 130. According to another example, the inner surface of the mounting hole 140 may be covered with an insulating coating. According to yet another example, screws that are coated with an electrically insulating layer may be used.

Figure 1B:
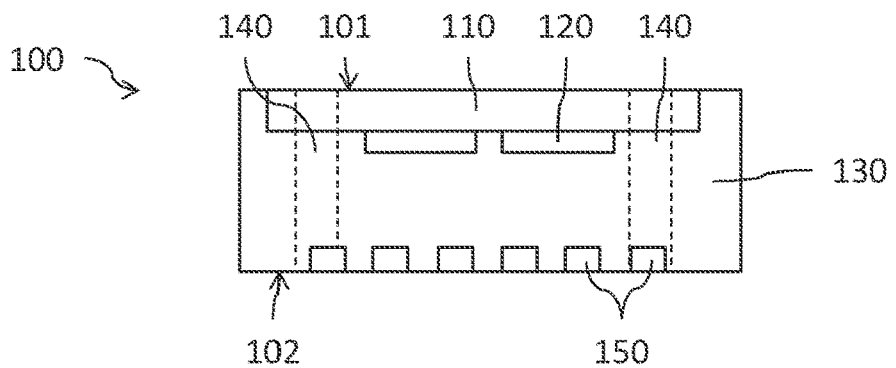

FIG. 1B shows a side view of the semiconductor package 100. In the example shown in FIG. 1B the mounting holes 140 are indicated using dashed lines.

The semiconductor package 100 may comprise external contacts 150 that are arranged on the second side 102. At least some of the external contacts 150 may be electrically coupled to the chip carrier 110 and/or to the semiconductor chip 120 (this is not shown in FIG. 1B for the sake of simplicity). Electrical coupling may e.g. be done using bond wires, ribbons or contact clips. At least some of the external contacts 150 may be integral with the chip carrier 110. The external contacts 150 may e.g. be part of a leadframe. The external contacts 150 may be configured to be surface mounted to e.g. an application board. According to an example, the external contacts 150 may be gull-wing type contacts. According to an example, the external contacts do not extend beyond a circumference of the semiconductor package as seen from above the first side 101.

As shown in FIG. 1B, the chip carrier 110 may be arranged in a first plane (in particular, at the first side 101 of the semiconductor package 100) and the external contacts may be arranged in a different second plane (in particular, at the second side 102).

The external contacts 150 may comprise one or more power contacts (drain-, source-, collector- or emitter-contacts), control contacts (gate contacts) or sensing contacts (e.g. temperature sensing contacts).

Figure 2:
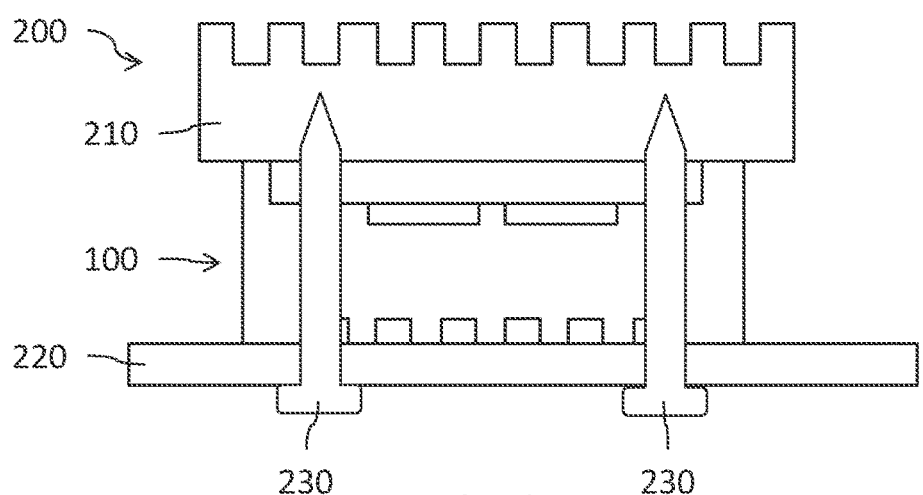
FIG. 2 shows a side view of a semiconductor assembly comprising a semiconductor package, a heatsink and an application board.

FIG. 2 shows a side view of a semiconductor assembly 200 comprising the semiconductor package 100, a heatsink 210 and an application board 220. The heatsink 210 is arranged on the first side 101 of the semiconductor package 100 and the semiconductor package 100 itself is arranged on the application board 220 such that the second side 102 faces the application board.

The heatsink 210 is mounted onto the semiconductor package 100 using screws 230 that are arranged in the mounting holes 140. According to an example, the screws 230 may completely extend through the semiconductor package 100 and they may further extend through the application board 220. The screws 230 may therefore also help to mount the semiconductor package 100 onto the application board 220.

FIG. 2 shows that the screws 230 do not completely extend through the heatsink 210. However, according to another example it is also possible that the screws 230 completely extend through the heatsink 210. In the semiconductor assembly 200, the nuts of the screws 230 may be arranged at the heatsink 210 or on the opposite side at the assembly board 220. According to an example, the screws 230 may be M3 type screws.

In the semiconductor assembly 200 the heatsink 210 may be electrically insulated from the chip carrier 110. Such an electrical insulation may for example be achieved by applying a layer of electrically insulating material (e.g. thermal interface material, TIM) between the chip carrier 110 and the heatsink 210. Furthermore, the screws 230 may be electrically insulated from the heatsink 210 and/or the application board 220. It is however also possible that e.g. the heatsink and the screws 230 are not electrically insulated from one another.

Fabricating the semiconductor assembly 200 may comprise arranging the semiconductor package 100 over the application board 220 and soldering the external contacts 150 to conductive traces of the application board 220. Fabricating the semiconductor assembly 200 may further comprise arranging the heatsink 210 over the semiconductor package 100 and screw mounting the heatsink 210 onto the semiconductor package 100.

According to an example, the heatsink 210 may be arranged over the semiconductor package 100 after the semiconductor package 100 has been soldered onto the application board 220. According to another example, soldering may be performed after the heatsink 210 has been screw mounted onto the semiconductor package 100 (and the semiconductor package 100 has thereby been screw mounted onto the application board 220).

Figure 3A:
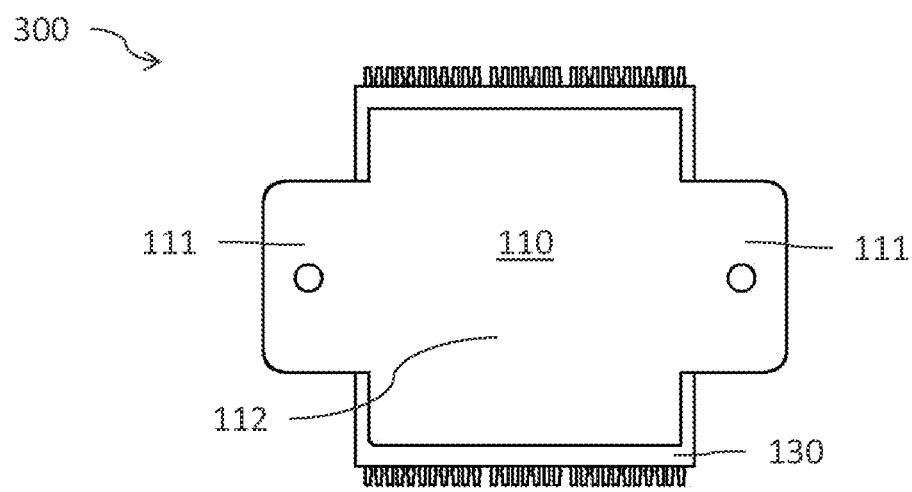
FIGS. 3A and 3B show a top-down view (FIG. 3A) and a side view (FIG. 3B) of a semiconductor package and a semiconductor assembly, wherein a carrier comprises fixture portions that each comprise a mounting hole.

FIG. 3A shows a top-down view of a further semiconductor package 300, which may be similar or identical to the semiconductor package 100, except for the differences mentioned in the following.

In semiconductor package 300 the chip carrier 110 comprises two fixture portions 111 on opposite edges of the chip carrier 110. As shown in FIG. 3A, the fixture portions 111 are exposed at the encapsulation body 130. The fixture portions 111 and the die mounting portion 112 may be coplanar and may be exposed at the encapsulation body 130 on the first side 101 of the semiconductor package 300.

Furthermore, the fixture portions 111 may extend beyond a circumference of the encapsulation body 130 as seen from above the first side 101. In particular, a first fixture portion 111 may extend out of the encapsulation body 130 on the left side (compare FIG. 3A) of the encapsulation body 130 and a second fixture portion 111 may extend out of the encapsulation body 130 on the right side.

Figure 3B:
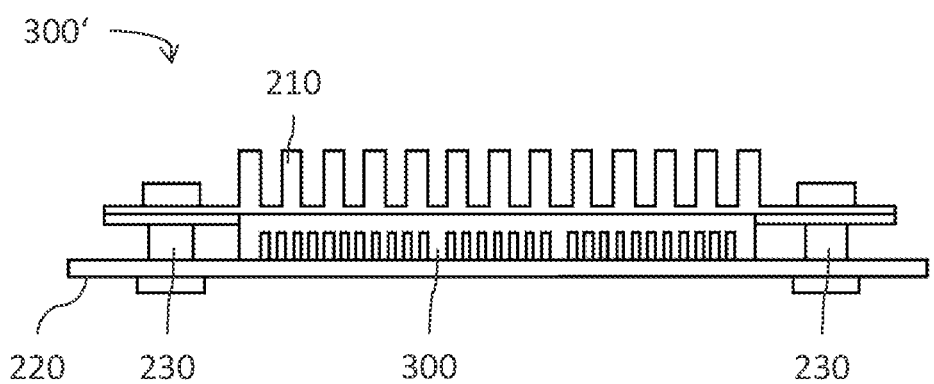

FIG. 3B shows a side view of a semiconductor assembly 300' comprising semiconductor package 300, heatsink 210 and application board 220. As shown in FIG. 3B, the screws 230 do not extend through the encapsulation body 130 but instead are arranged laterally besides the encapsulation body 130. The fixing portions 111 of the chip carrier 110 are shown to be arranged in a plane above the application board 220. However, according to another example it is also possible that the fixing portions 111 are bent down towards the application board 220.

Figure 4A:
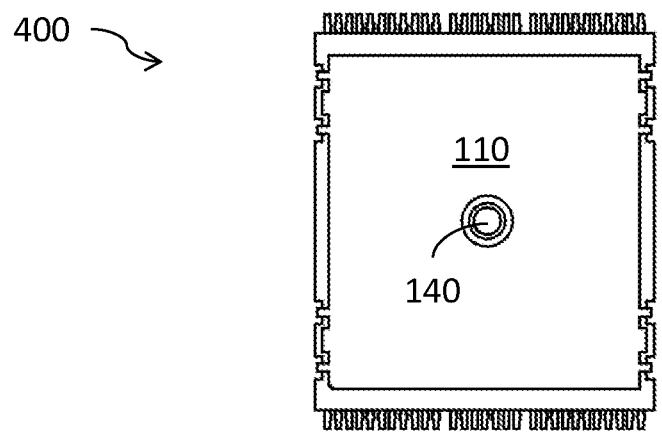
FIGS. 4A to 4C show top-down views (FIGS. 4A and 4B) and a side view of further examples of a semiconductor package and a semiconductor assembly.

FIG. 4A shows a top-down view of a semiconductor package 400, which may be similar or identical to the semiconductor packages 100 and 300, except for the differences mentioned in the following.

In semiconductor package 400 the mounting hole 140 is arranged centrally in the chip carrier 110. The semiconductor package 400 may comprise one or more semiconductor chips 120 which may e.g. be arranged symmetrically around the mounting hole 140.

As shown in FIG. 4A, the mounting hole 140 may have a larger diameter than a screw 230 that is intended to be put into the mounting hole 140. An inner surface of the mounting hole 140 may therefore be completely covered by a material layer, e.g. an insulating material layer and in particular a layer of the material of the encapsulation body 130.

Figure 4B:
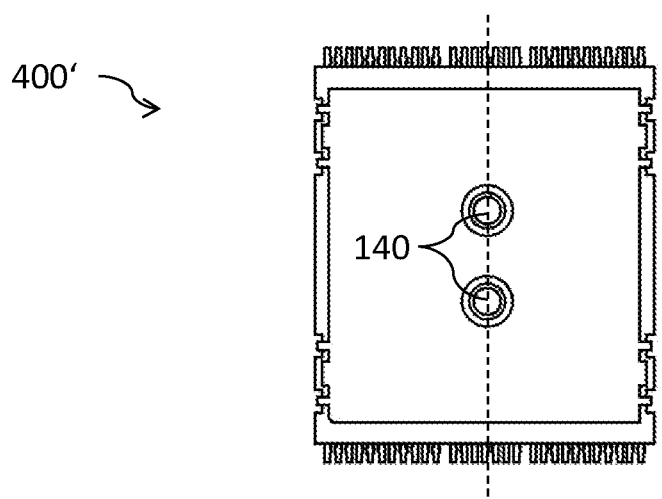

FIG. 4B shows a top-down view of a further semiconductor package 400', which may be identical to the semiconductor package 400, except that the semiconductor package 400' comprises two mounting holes 140 instead of a single mounting hole 140. The two (or more) mounting holes 140 may e.g. be arranged along a mirror axis of the semiconductor package 400'. For example, the mounting holes 140 may be arranged along the mirror axis that runs parallel to the longer side of the semiconductor package 400'.

Figure 4C:
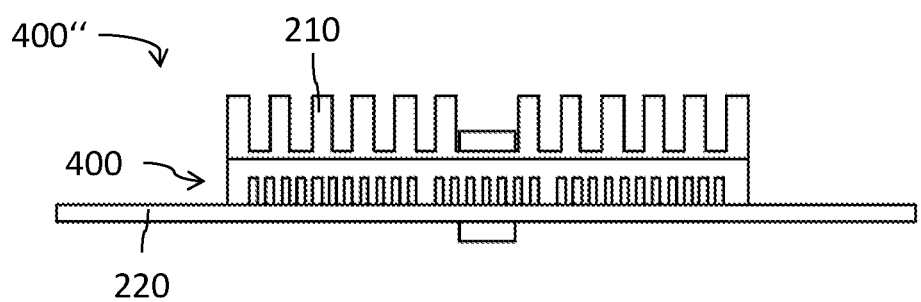

FIG. 4C shows a side view of a semiconductor assembly 400" that comprises the semiconductor package 400 or the semiconductor package 400', heatsink 210 arranged on the semiconductor package 400 (or 400') and application board 220, wherein the semiconductor package 400 or 400' is arranged on the application board 220. The screw(s) 230 may be arranged centrally in the semiconductor package 400 or 400' and the heatsink 210.

Figure 5A:
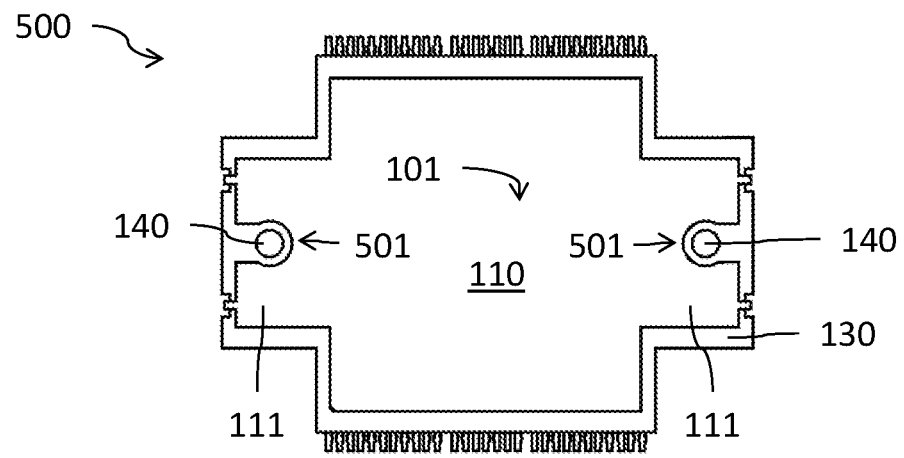
FIGS. 5A and 5B show a top-down view (FIG. 5A) and a side view (FIG. 5B) of a semiconductor package and a semiconductor assembly, wherein mounting holes are arranged in the encapsulation body of the semiconductor package.

FIG. 5A shows a top-down view of a further semiconductor package 500, which may be similar or identical to the semiconductor packages 100, 300, 400 and 400', except for the differences mentioned in the following.

Semiconductor package 500 may comprise two fixture portions 111 of the chip carrier 110 similar to semiconductor package 300. However, in semiconductor package 500 the fixture portions may not extend beyond a circumference of the encapsulation body 130. Instead, the whole of the chip carrier 110 may be covered by the encapsulation body 130 on all sides except the first side 101.

The fixture portions 111 in semiconductor package 500 may comprise salients 501 that are configured to receive the mounting holes 140. To this end, the salients 501 may have a width that is larger than the diameter of the mounting holes 140. The salients 501 may be filled with the material of the encapsulation body 130 and the mounting holes 140 may be arranged in this material.

Figure 5B:
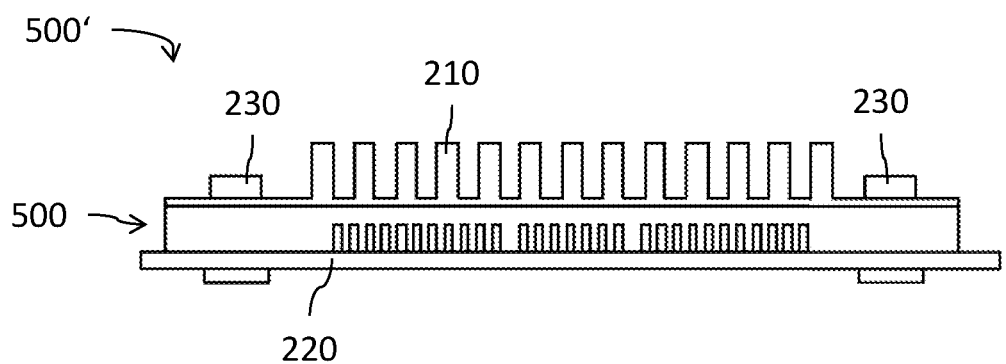

FIG. 5B shows a side view of a semiconductor assembly 500' comprising semiconductor package 500, heatsink 210 and application board 220. As shown in FIG. 5B, the screws 230 may extend through the heatsink 210, the encapsulation body 130 and the application board 220.

Figure 6:
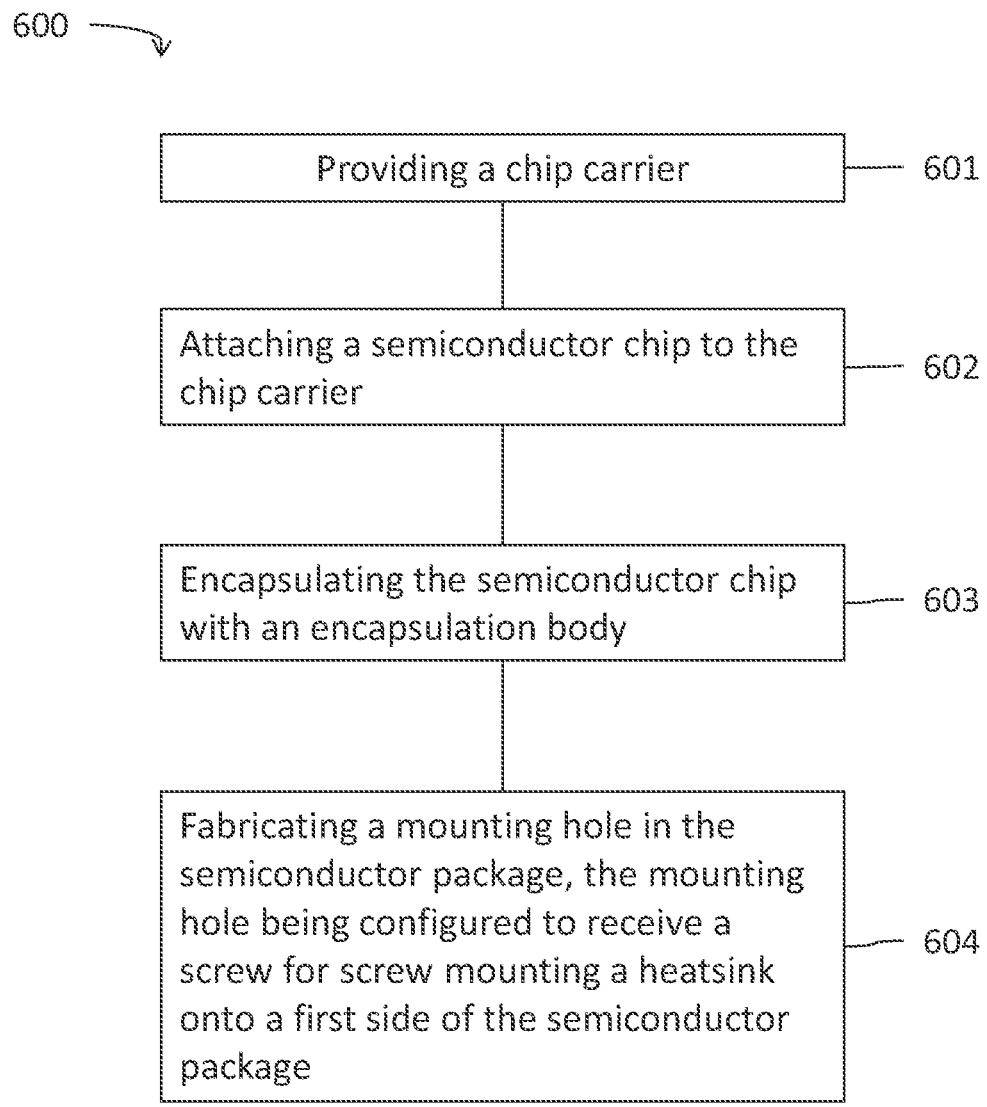
FIG. 6 shows a flow chart of a method for fabricating a semiconductor package.

FIG. 6 shows a flow chart of a method 600 for fabricating a semiconductor package. The method 600 may e.g. be used to fabricate a semiconductor package like the semiconductor packages 100 and 300-500.

Method 600 comprises at 601 providing a chip carrier, at 602 attaching a semiconductor chip to the chip carrier, at 603 encapsulating the semiconductor chip with an encapsulation body, and at 604 fabricating a mounting hole in the semiconductor package, the mounting hole being configured to receive a screw for screw mounting a heatsink onto a first side of the semiconductor package. According to method 600 a second side of the semiconductor package opposite the first side is configured to be surface mounted to an application board.

According to an example of method 600, fabricating the mounting hole comprises mechanically drilling or laser drilling into the semiconductor package (in particular, into the encapsulation body 130). The method 600 may further comprise arranging an electrically insulating material in the mounting hole, the insulating material configured to electrically insulate a screw in the mounting hole from the chip carrier. Furthermore, according to an example of method 600, the mounting hole is fabricated after the encapsulation body has been formed.

EXAMPLES

In the following, the semiconductor package, the semiconductor assembly and the method for fabricating a semiconductor package are further explained using particular examples.

Example 1 is a semiconductor package, comprising: a chip carrier, a semiconductor chip attached to the chip carrier, an encapsulation body encapsulating the semiconductor chip, and a mounting hole configured to receive a screw for screw mounting a heatsink onto a first side of the semiconductor package, wherein a second side of the semiconductor package opposite the first side is configured to be surface mounted to an application board.

Example 2 is the semiconductor package of example 1, wherein the mounting hole completely extends through the semiconductor package from the first side to the second side.

Example 3 is the semiconductor package of example 1 or 2, wherein the chip carrier is exposed at the encapsulation body at the first side of the semiconductor package.

Example 4 is the semiconductor package of one of the preceding examples, wherein the semiconductor package comprises two mounting holes that are arranged at opposing edges of the semiconductor package.

Example 5 is the semiconductor package of one of examples 1 to 3, wherein the mounting hole is arranged at the center of the first side of the semiconductor package.

Example 6 is the semiconductor package of one of the preceding examples, wherein the mounting hole extends through the chip carrier.

Example 7 is the semiconductor package of example 6, wherein the chip carrier comprises a fixture portion configured to accommodate the mounting hole but no semiconductor chips.

Example 8 is the semiconductor package of one of examples 1 to 5, wherein the mounting hole is arranged in the encapsulation body laterally besides the chip carrier.

Example 9 is the semiconductor package of one of the preceding examples, wherein an inner surface of the mounting hole comprises an electrically insulating material to electrically insulate a screw in the mounting hole from the chip carrier.

Example 10 is the semiconductor package of example 8, wherein the electrically insulating material corresponds to the material of the encapsulation body.

Example 11 is the semiconductor package of one of the preceding claims, further comprising: external contacts for electrically contacting the semiconductor chip, wherein the external contacts are arranged on the second side of the semiconductor package.

Example 12 is a semiconductor assembly, comprising: a semiconductor package comprising a chip carrier, a semiconductor chip attached to the chip carrier, an encapsulation body encapsulating the semiconductor chip, and a mounting hole, the semiconductor assembly further comprising: a heatsink arranged on a first side of the semiconductor package, a screw arranged in the mounting hole and mounting the heatsink to the first side of the semiconductor package, and an application board, wherein a second side of the semiconductor package opposite the first side is surface mounted to the application board.

Example 13 is the semiconductor assembly of example 12, wherein the screw extends through the semiconductor package and through the application board.

Example 14 is a method for fabricating a semiconductor package, the method comprising: providing a chip carrier, attaching a semiconductor chip to the chip carrier, encapsulating the semiconductor chip with an encapsulation body, and fabricating a mounting hole in the semiconductor package, the mounting hole being configured to receive a screw for screw mounting a heatsink onto a first side of the semiconductor package, wherein a second side of the semiconductor package opposite the first side is configured to be surface mounted to an application board.

Example 15 is the method of example 14, wherein fabricating the mounting hole comprises mechanically drilling or laser drilling into the semiconductor package.

Example 16 is the method of example 14 or 15, further comprising: arranging an electrically insulating material in the mounting hole, the insulating material configured to electrically insulate a screw in the mounting hole from the chip carrier.

Example 17 is the method of one of examples 14 to 16, wherein the mounting hole is fabricated after the encapsulation body has been formed.

Example 18 is an apparatus comprising means to perform the method according to one of examples 14 to 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor package, comprising: a chip carrier having a uniform thickness across the whole chip carrier and comprising a metal, a semiconductor chip attached to and electrically contacting the chip carrier, an encapsulation body encapsulating the semiconductor chip, and a mounting hole configured to receive a screw for screw mounting a heatsink onto a first side of the semiconductor package, which is located above the semiconductor chip, wherein a second side of the semiconductor package, which is located below the semiconductor chip and opposite the first side is configured to be surface mounted to an application board, wherein the chip carrier at the encapsulation body is exposed at the first side of the semiconductor package, wherein the first side of the semiconductor package is planar, and wherein an outer surface of the chip carrier is coplanar with an outer surface of the encapsulation body at the first side of the semiconductor package.

2. The semiconductor package of claim 1, wherein the mounting hole completely extends through the semiconductor package from the first side to the second side.

3. The semiconductor package of claim 1, wherein the semiconductor package comprises two mounting holes that are arranged at opposing edges of the semiconductor package.

4. The semiconductor package of claim 1, wherein the mounting hole is arranged at the center of the first side of the semiconductor package.

5. The semiconductor package of claim 1, wherein the mounting hole extends through the chip carrier.

6. The semiconductor package of claim el, wherein the chip carrier comprises a fixture portion configured to accommodate the mounting hole but no semiconductor chips.

7. The semiconductor package of claim 1, wherein the mounting hole is arranged in the encapsulation body laterally besides the chip carrier.

8. The semiconductor package of claim 1, wherein an inner surface of the mounting hole comprises an electrically insulating material to electrically insulate a screw in the mounting hole from the chip carrier.

9. The semiconductor package of claim 8, wherein the electrically insulating material corresponds to the material of the encapsulation body.

10. The semiconductor package of claim 1, further comprising:
external contacts for electrically contacting the semiconductor chip, wherein the external contacts are arranged on the second side of the semiconductor package.

11. A semiconductor assembly, comprising: a semiconductor package, comprising: a chip carrier having a uniform thickness across the whole chip carrier and comprising a metal, a semiconductor chip attached to and electrically contacting the chip carrier, an encapsulation body encapsulating the semiconductor chip, and a mounting hole, a heatsink arranged on a first side of the semiconductor package, the first side being located above the semiconductor chip, a screw arranged in the mounting hole and mounting the heatsink to the first side of the semiconductor package, and an application board, wherein a second side of the semiconductor package which is located below the semiconductor chip and opposite the first side is surface mounted to the application board, and wherein the chip carrier on the encapsulation body is exposed on the first side of the semiconductor package, wherein the first side of the semiconductor package is planar, and wherein an outer surface of the chip carrier is coplanar with an outer surface of the encapsulation body at the first side of the semiconductor package.

12. The semiconductor assembly of claim 11, wherein the screw extends through the semiconductor package and through the application board.

13. The semiconductor assembly of claim 11, wherein the mounting hole is arranged at the center of the first side of the semiconductor package.

14. The semiconductor assembly of claim 11, wherein the mounting hole extends through the chip carrier.

15. The semiconductor assembly of claim 11, wherein the chip carrier comprises a fixture portion configured to accommodate the mounting hole but no semiconductor chips.

16. A semiconductor package, comprising: a chip carrier having a uniform thickness across the whole chip carrier and comprising a metal, a semiconductor chip attached to and electrically contacting the chip carrier, an encapsulation body encapsulating the semiconductor chip, and a mounting hole configured to receive a screw for screw mounting a heatsink onto a first side of the semiconductor package, which is located above the semiconductor chip, wherein a second side of the semiconductor package, which is located below the semiconductor chip and opposite the first side is configured to be surface mounted to an application board, wherein the chip carrier at the encapsulation body is exposed at the first side of the semiconductor package, and wherein the mounting hole extends through the chip carrier.

17. The semiconductor package of claim 16, wherein the first side of the semiconductor package is planar, and
   wherein an outer surface of the chip carrier is coplanar with an outer surface of the encapsulation body on the first side of the semiconductor package.

18. The semiconductor package of claim 16, wherein the mounting hole extends through a center of the chip carrier.

19. The semiconductor package of claim 16, wherein the semiconductor package comprises two mounting holes that are arranged at opposing edges of the semiconductor package and extend through the chip carrier.

20. The semiconductor package of claim 16, further comprising:
   a plurality of semiconductor chips attached to the chip carrier.

\* \* \* \* \*